(12) United States Patent
Poechnueller

(10) Patent No.: US 6,839,267 B1
(45) Date of Patent: Jan. 4, 2005

(54) STRUCTURE AND METHOD OF MULTIPLEXING BITLINE SIGNALS WITHIN A MEMORY ARRAY

(75) Inventor: Peter Poechnueller, Unterhaching (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/618,333

(22) Filed: Jul. 11, 2003

(51) Int. Cl.$^7$ ................................................ G11C 5/06
(52) U.S. Cl. ........................ 365/149; 365/63; 257/306
(58) Field of Search ........................ 365/63, 149, 194; 438/268; 257/306

(56) References Cited

U.S. PATENT DOCUMENTS 5,917,744 A * 6/1999 Kirihata et al. ............... 365/63
6,399,447 B1 * 6/2002 Clevenger et al. ........... 438/268
6,456,521 B1 * 9/2002 Hsu et al. ..................... 365/149
6,504,204 B1 * 1/2003 Hsu et al. ..................... 257/306
2002/0196651 A1   12/2002 Weis

* cited by examiner

Primary Examiner—Vu A. Le
(74) Attorney, Agent, or Firm—Lerner, David, Littenberg, Krumholz & Mentlik, LLP (57) ABSTRACT

An integrated circuit memory is provided in which a multiplexer is operable to select one of a plurality of bitlines to couple to a master bitline using select transistors of an array of transistors, the array of transistors including access transistors of a storage cell array of the memory.

20 Claims, 7 Drawing Sheets

STRUCTURE AND METHOD OF MULTIPLEXING BITLINE SIGNALS WITHIN A MEMORY ARRAY

BACKGROUND OF THE INVENTION

As the storage capacity of an integrated circuit (IC) memory is increased from one generation to the next, the sizes of memory arrays increase, as measured in terms of the row and column space of the array, i.e., the number of wordlines of the memory array, as multiplied by the number of bitlines of the memory array. Memory arrays having larger numbers of wordlines and bitlines generally have less overhead in form of support circuitry for accessing the arrays, as a percentage of the total IC area occupied by the memory. Support circuitry including row decoders, wordline drivers, column decoders, first sense amplifiers and second sense amplifiers, etc. must be provided for every memory array on the IC. However, such support circuitry takes up a significant amount of IC area that cannot be used for the storage of data. To increase the utilization efficiency of IC area, it is therefore advantageous to increase the numbers of wordlines and bitlines of each memory array relative to the numbers of circuits provided therein for support of the memory array.

In a conventional dynamic random access memory (DRAM), it is evident that a single memory array cannot have a row space including an arbitrary number of wordlines that is served by a single set of the same bitlines, because the bitlines which span the row space would have very large capacitance, such that the charge stored on a capacitor of a storage cell coupled to the bitline would appear as an extremely small signal, making it difficult to read the storage cell. In addition, the large capacitance of the bitline has an RC time constant which inhibits the speed of accessing cells of the memory array. Even at the scale of integration density in today's leading DRAM technology, bitline capacitance can be, for example, 200 fF, which significantly exceeds the capacitance of a storage cell within the DRAM, which is, for example, 30 fF, such that bitline capacitance may soon become a limiting factor in the design of DRAMs.

Figure 1A:
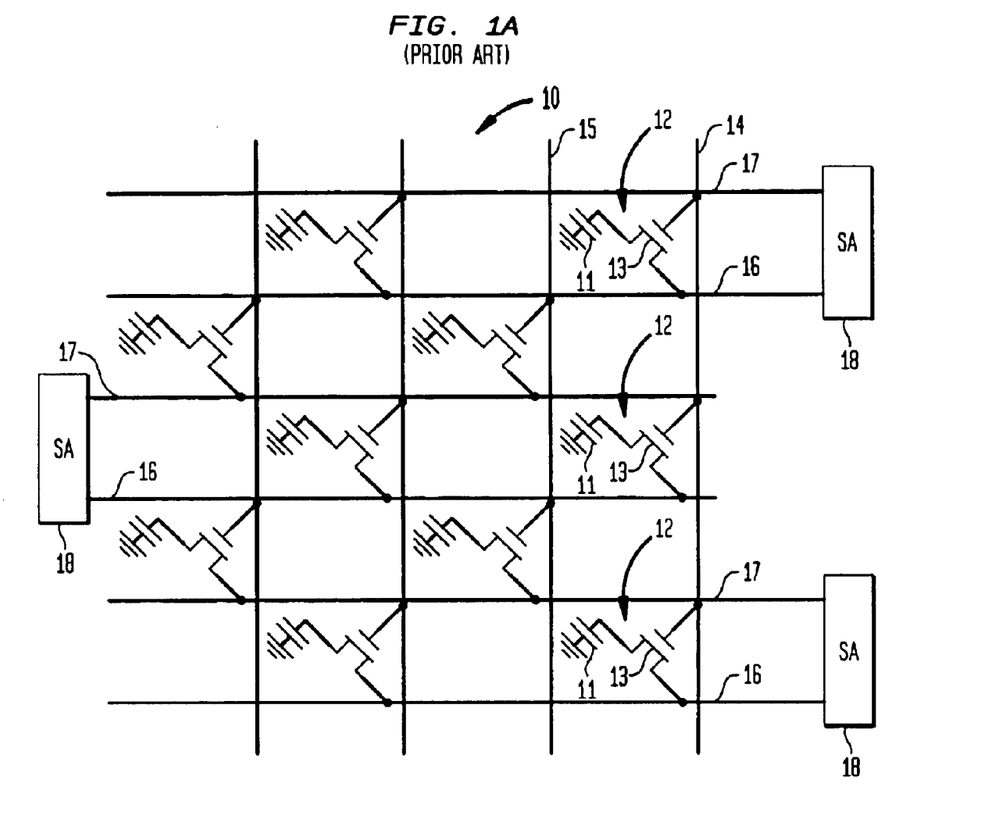
FIGS. 1A and 1B are plan views schematically illustrating a memory array of a dynamic random access memory (DRAM).

FIG. 1A illustrates schematically, in plan view, a memory cell array of a dynamic random access memory (DRAM). As shown in FIG. 1A, a memory cell array 10 of a DRAM includes a plurality of storage cells 12, each including a capacitor 11 for storing a charge representing a data bit, and an access transistor 13 for controlling the transfer of the charge representing the data bit to and from the capacitor 11 of the storage cell 12. A plurality of substantially parallel wordlines 14 and 15 are provided for operating the access transistors 13. A plurality of substantially parallel bitlines 16 and 17 are also provided in a direction transverse to the wordlines, each coupled to storage cells 12 of the array 10 and sense amplifiers 18 for transferring a data bit signal therebetween.

Figure 1B:
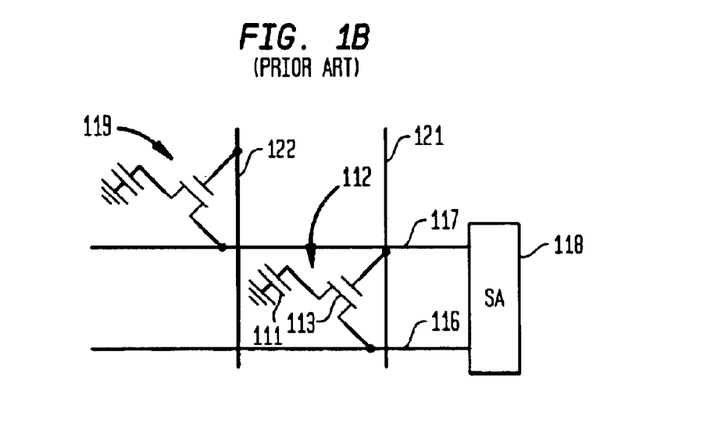

In a typical read operation, a wordline 14 is activated by raising the voltage thereon to turn on transistors 13 that have gates coupled to the wordline 14, such that the charges stored on capacitors 11 of storage cells 12 connected to those transistors 13 is transferred to corresponding ones of the bitlines 16. On each bitline 16, therefore, a data bit signal corresponding to the change in one accessed storage cell is transferred to a corresponding sense amplifier 18. As shown in FIG. 1B, when a particular wordline 121 is active, a sense amplifier 118 connected thereto amplifies a small voltage difference signal between the bitline 116 that is currently accessed and a non-accessed bitline 117 to full high and low logic levels, thereby determining the value of the data bit read from a storage cell 112 coupled thereto. Writeback is then usually performed from the sense amplifier 118 to the storage cell 112, because when the data bit signal is read, the charge stored on the storage capacitor 111 is transferred to the bitline 116 and consequently no longer exists in storage capacitor 111. When a wordline 121 is activated, a bitline 116 is accessed, while bitline 117 acts only as a reference input to sense amplifier 118. This arrangement assures that noise that may be present on both the bitline 116 and the reference bitline 117 cancel each other out in sense amplifier 118. On the other hand, when a different wordline 122 is activated, a storage cell 119 on a bitline 117 is accessed, while bitline 116 acts only as a reference input to the sense amplifier 118. When bitline 116 and reference bitline 117 are located adjacent to each other in the same array, as described here, this is known as folded bitline sensing.

A typical write operation begins by first reading the storage cell 112 that is to be written. This is performed by activating a wordline 121, which turns on transistor 113 of the storage cell 112. This has the effect of clearing the data bit stored before that time from the storage cell 112 by transferring the charge stored in capacitor 111 to the bitline 116. A signal representing the data bit stored in the storage cell 112 coupled to the wordline 121 is then transferred on the bitline 116 to the sense amplifier 118 where the signal is then amplified to a high or a low logic level. Thereafter, a data bit is written to a selected storage cell 112 that is accessed by the active wordline 121, while remaining storage cells 112 (not shown) accessed by the activated wordline 121 are written back from other sense amplifiers (not shown) with the data that they stored prior to being read. This is known as a read modified write operation, as the writing of a selected storage cell 112 accompanies the reading and restoring of data to other storage cells (not shown) which are accessed by the same activated wordline 121.

Figure 2A:
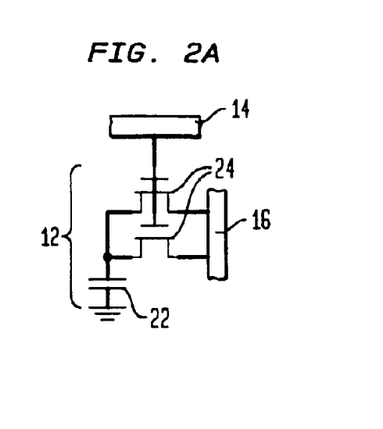
FIG. 2A schematically illustrates the arrangement of a storage cell of a memory array in relation to which an embodiment of the invention is provided.
Figure 2B:
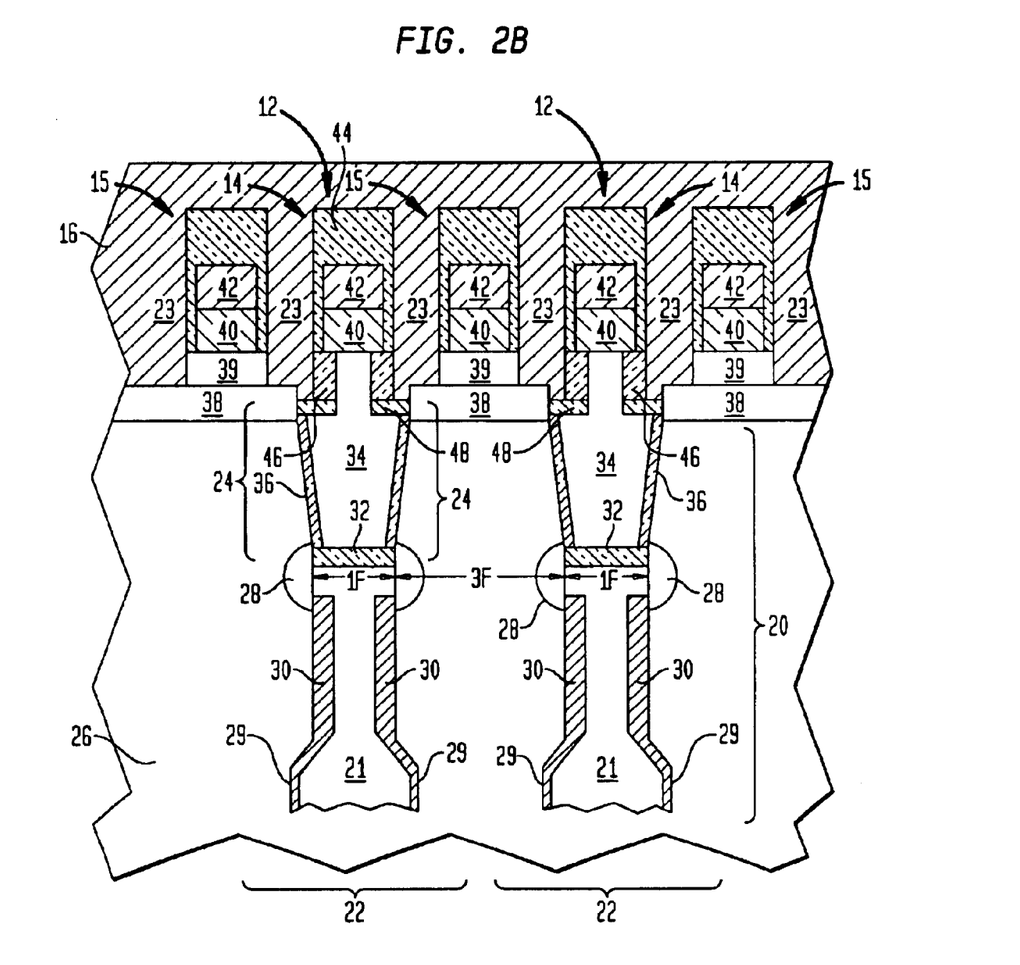
FIG. 2B is a cross-sectional diagram illustrating features of a memory array in relation to which an embodiment of the invention is provided.

FIG. 2A schematically illustrates the configuration of a storage cell 12 of a memory array 10, in relation to which an embodiment of the invention is provided. The storage cell comprises a storage capacitor 22 having one plate tied to a reference voltage (typically ground as shown in FIG. 2A or half of the bitline high voltage) and having its other plate tied to the sources of access transistors 24. The access transistors 24 are coupled in parallel, having drains tied to bitline 16 and gates tied to wordline 14. With reference to FIG. 2B, as described in greater detail below, storage capacitor 22 is formed within a deep trench 20, and the sources and conduction channels of access transistors 24 are formed along sidewalls of an upper region of the deep trench 20 above the storage capacitor 22. Additionally, the gates of the access transistors are formed within the upper region of deep trench 20, above the trench top oxide (TTO) 32. An advantage of the arrangement shown in FIG. 2A is that the drains 38 of access transistors 24 are formed on both sides of deep trench 20, which provides the equivalent of twice the channel width of other transistors having comparable gate lengths.

FIG. 2B illustrates an array of storage cells 12, which is described in commonly assigned published U.S. Patent Application Publication No. US 2002/0196651 A1 and is background to the present invention, but which is not admitted to be prior art. The illustrated cross section is shown in the direction of a bitline 16. As shown in FIG. 2B, storage capacitor 22 is formed within the deep trench 20 etched into a single crystal semiconductor of a substrate 26. Deep trench 20 also comprises a heavily doped buried strap regions 28, which provides source regions (hereinafter, "source") for access transistors 24. Each of the buried strap source regions 28 are electrically connected to the node electrode 21 formed within the lower region of the deep trench 20, thus forming the connection between access transistors 24 and the storage capacitor 22. Deep trench 20 also includes trench collar oxide 30 and trench top oxide 32, which prevent parasitic current leakages.

In addition to the buried strap source region 28, each access transistor 24 also includes doped gate polysilicon (hereinafter, "poly") 34, formed within the upper region of deep trench 20 and gate oxide 36. Note that gate oxide 36 is formed on sidewalls of the upper region of the trench 20 and is contacted by gate poly 34. As further shown in FIG. 2B, the gate poly 34 is contacted by an active wordline 14. Each access transistor 24 further includes a drain region 38 located near the top surface of the single-crystal semiconductor of the substrate. Each drain region 38 is connected to the bitline 16 via bitline contacts 23.

Note that other wordlines 15 are shown in FIG. 2B. These wordlines are connected to other storage cells, but not the storage cells being illustrated in FIG. 2B. As such, those wordlines 15 are referred to as passing wordlines as per FIG. 2B, whereas the wordline 14 contacting gate poly 34 is referred to as an active wordline. In an exemplary embodiment, wordlines 14 and 15 include a low resistive conductor layer formed on an optional barrier layer over heavily doped polysilicon. For example, the wordline may be formed as a dual layer conductor including layers of polysilicon and tungsten nitride 40, over which is formed a tungsten or tungsten silicide (WSi) layer 42. The conductive layers are surrounded by a nitride insulating layer 44 to insulate the wordlines from bitline contacts 23 and the bitline 16. Additionally, gate poly 34 is insulated from adjacent features, such as doped regions 38, by an insulating spacer 46 and insulating cap 48. Spacer 46 is preferably formed of an oxide layer and cap 48 is preferably formed of a nitride. Other materials could be substituted depending upon the process flow, provided adequate isolation is provided to gate poly 34. The passing wordline 15 is insulated from the doped regions 38 by an array top oxide (ATO) 39.

As shown in FIG. 2B, each storage cell 12 includes two access transistors 24. Each access transistor 24 shares a common gate poly 34, but there are two gate oxides 36, two sources 28, and two drains 38. Each drain region 38 of each transistor has two contacts 23 to the bitline 16. Each transistor 24 further shares a common drain region 38 with a neighboring transistor.

In view of the foregoing, it would be desirable to reduce the length of bitlines of a memory array, such that capacitance of the bitlines are reduced, thereby permitting bitline signals to be distinguished, while keeping the access time of the memory array within target.

It would further be desirable to multiplex signals of bitlines having reduced length onto a master bitline by transistors of an array of transistors of a memory array.

It would further be desirable to provide a plurality of transistors used for multiplexing bitline signals on to a master bitline within the same well within which transistors of an array of transistors of a memory are provided.

SUMMARY OF THE INVENTION

According to an aspect of the invention, an integrated circuit memory is provided in which a multiplexer is operable to select a bitline of a plurality of bitlines to couple to a signal line, e.g. a master bitline. The multiplexer selects the bitline using a select transistor provided in an array of transistors formed within a first well of semiconductor region of a substrate, the array of transistors including access transistors of a storage cell array of the memory.

According to another aspect of the invention, an integrated circuit includes a memory, the memory including:
an array of transistors formed within a first well of a single-crystal semiconductor region of a substrate;
a plurality of storage cells each including an access transistor, the access transistor being a transistor of the array of transistors;
a plurality of bitlines, each bitline coupled to the access transistors of respective storage cells of the plurality of storage cells; and
a multiplexer including a first select transistor and a second select transistor of a plurality of select transistors, the plurality of select transistors being transistors of the array of transistors, the first select transistor being operable to select a first bitline of the plurality of bitlines to couple to a signal line, and the second select transistor being operable to select a second bitline of the plurality of bitlines to couple to the signal line.

According to another aspect of the invention, a method of operating a memory of an integrated circuit includes:
providing a memory including:
an array of transistors formed within a first well of a single-crystal semiconductor region of a substrate, the array of transistors including first and second select transistors;
a plurality of storage cells each including an access transistor, the access transistor being a transistor of the array of transistors;
a plurality of bitlines including a first bitline and a second bitline, each bitline coupled to the access transistors of respective storage cells of the plurality of storage cells;
operating the first select transistor to connect the first bitline to a master bitline; and
operating the second select transistor to connect the second bitline to a master bitline.

DETAILED DESCRIPTION

Figure 3A:
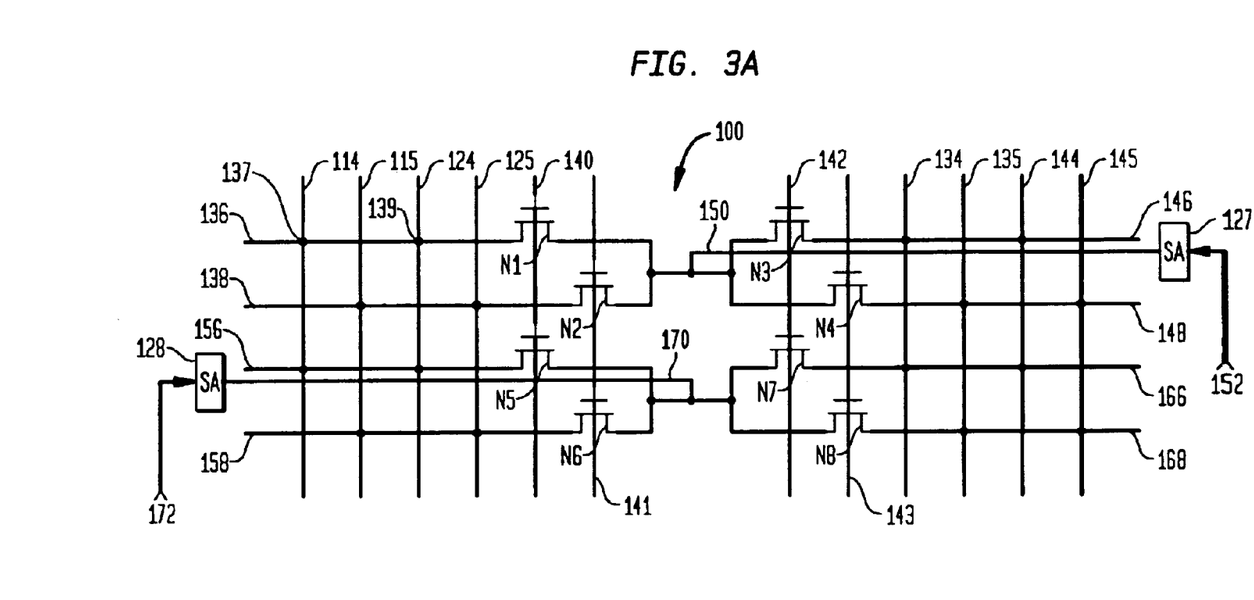
FIG. 3A is a schematic diagram illustrating a first embodiment of a structure for multiplexing bitlines.

Accordingly, in a first embodiment of the invention, as shown in FIG. 3A, an integrated circuit including a memory is provided in which a signal on a bitline e.g., bitline 136, of a plurality of bitlines, is selectably coupled by a select transistor N1 of an array of transistors formed in the same well to a multiplexed signal line being a master bitline 150. This structure is preferably repeated within the memory, such that a plurality of select transistors are formed in the same well as, and preferably by substantially the same process as, storage cell access transistors of the transistor array. Each multiplexed signal line preferably includes a master bitline for transferring the signal to and/or from a sense amplifier. In such manner, signals are multiplexed from a plurality of local bitlines onto a master bitline, and are preferably demultiplexed from the master bitline onto a plurality of local bitlines.

As described above, each bitline of a memory array which has a high integration density has considerable capacitance, e.g., on the order of 200 fF each, partly because of the length of the bitline in spanning the array. The capacitance of the bitline also depends much on the manner in which the bitline is formed using a line mask pattern to deposit the bitline conductor borderlessly over and between all of the wordlines along the line pattern. In such way, the bitline makes a contact 23 to the diffusion region 38 of the semiconductor substrate between every two adjacent wordlines 14 and 15, as shown in FIG. 2B. In the arrangement shown in FIG. 3A, multiplexing of local bitline signals onto a master bitline reduces the capacitance of each selected local bitline considerably, because the length of each local bitline in contact with the semiconductor substrate is divided by the number of local bitlines that replace each bitline. Consequently, each local bitline can transfer a stronger signal than would otherwise be the case if no changes were made to the arrangement that is shown in FIGS. 1A–2B.

FIG. 3A schematically illustrates a first embodiment of the invention. As will be described in greater detail below, a memory 100 includes an array of transistors. The array of transistors includes a plurality of access transistors included within storage cells of the memory for providing access to information stored within the storage cells. Bitlines are coupled to respective access transistors, each access transistor providing access to a particular storage cell of a row of storage cells, when selected by an activated wordline for the particular row of access transistors. With respect to a particular bitline, e.g. bitline 136, wordlines include active wordlines 114 and 124, and passing wordlines 115 and 125. Thus, a bitline 136 is coupled to access a storage cell 137, or 139 coupled thereto, whenever a wordline 114, or 124 is activated, respectively.

As further shown in FIG. 3A, a plurality of local bitlines 136, 138, 146, and 148 of the memory 100 are each selectably coupled to a master bitline 150 by select transistors N1, N2, N3 and N4, respectively. In turn, the master bitline 150 is coupled to a sense amplifier 127. At sense amplifier 127, the signal on master bitline 150 is sensed in relation to a reference signal 152, which may be a signal from a bitline of a non-accessed memory array (e.g., a non-accessed bank of the memory), or it may be a signal from a reference cell. As such, the arrangement shown in FIG. 3A provides for open bitline sensing, as opposed to folded bitline sensing, as shown and described above relative to FIG. 1.

In addition, a plurality of local bitlines 156, 158, 166, and 168 of the memory 100 are each selectably coupled to a master bitline 170 by select transistors N5, N6, N7 and N8, respectively, and master bitline 170 is coupled to a sense amplifier 128. At sense amplifier 128, the signal on master bitline 170 is sensed in relation to a reference signal 172, which may be a signal from a bitline of a non-accessed memory array (e.g., a non-accessed bank), or it may be a signal from a reference cell.

Figure 3B:
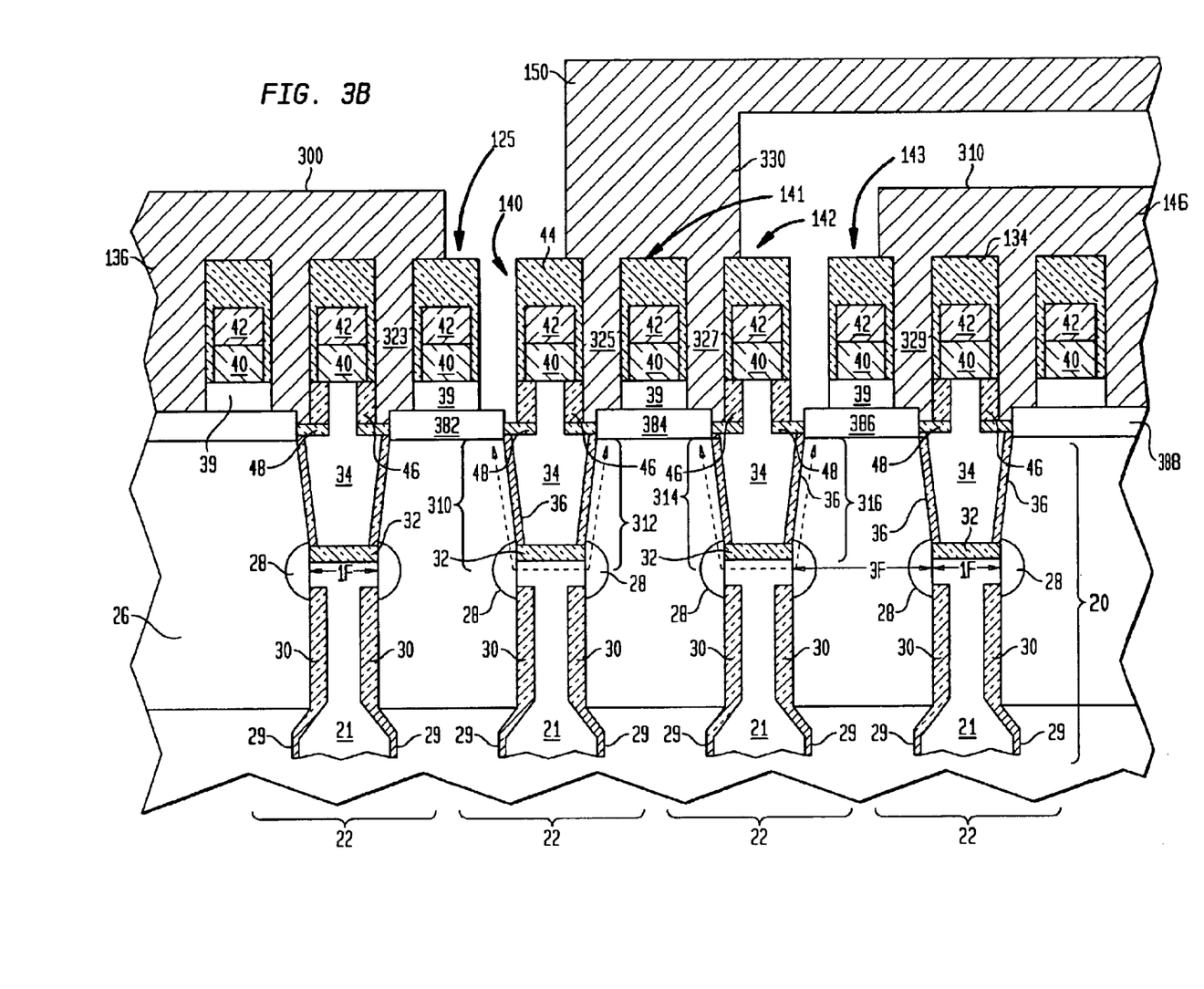
FIG. 3B is a cross-sectional diagram further illustrating the embodiment shown in FIG. 3A.
Figure 3C:
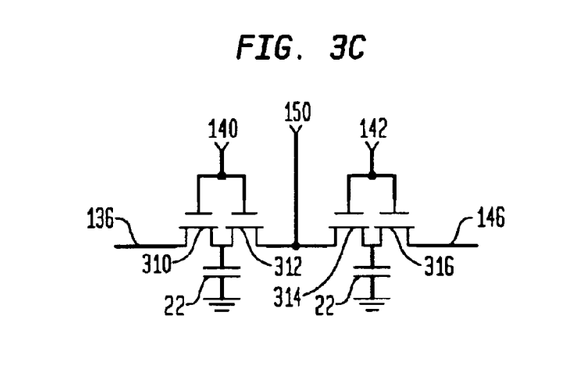
FIG. 3C is a schematic diagram illustrating a circuit equivalent for the embodiment shown in FIG. 3B.

FIG. 3B is a cross-sectional diagram of the embodiment shown in FIG. 3A through bitline 136, master bitline 150 and bitline 146. FIG. 3C is a schematic diagram illustrating a circuit equivalent for the embodiment shown in FIG. 3B. As shown on the left side of FIG. 3B, a bitline 136 has an end 300 where it contacts a drain diffusion region 382 at a passing conductor line 125. As shown on the right side of FIG. 3B, a bitline 146 has an end 310 where it contacts a drain diffusion region 386 at a passing conductor line 143. In between, a master bitline 150 contacts a drain diffusion region 384 on both sides of a passing selector line 141. As shown in FIG. 3B, bitlines 136 and 146 and master bitline 150 contact the respective drain diffusion regions borderlessly, meaning that the openings through which the conductive material is deposited to form the contacts need not be spaced apart from preexisting features such as passing selector lines 141 and 143, and the active selector lines 140 and 142. Such borderless contacts are possible because the selector lines, whether passing or active, are insulated by dielectric cap sidewall layers 44 which remain in place when the openings are formed, and retain their insulating function when the conductive material of the bitlines is deposited.

On the left side of FIG. 3B, the bitline 136 is selectably connected to master bitline 150 by the transistors 310 and 312 which are operated by active selector line 140. An equivalent circuit schematic is shown in FIG. 3C. Thus, active selector line 140 provides a selection input to the gates of a left vertical transistor 310, and a right vertical transistor 312 which are coupled in series between the bitline 136 and master bitline 150. A capacitor 22, which is the capacitor formed in the lower part of the trench 20 below transistors 310, 312, is coupled between the sources of transistors 310 and 312 and ground. This capacitor 22, in parallel to the signal path, although not generally a desired part of the circuit, has a tolerable value as a parasitic element, generally having a capacitance on the order of 30 fF, as compared to the total capacitance of the bitline which can be in the range of hundreds of fF. The same structure appears on the right side of FIGS. 3B–3C, different only in that the signal path from bitline 146 to master bitline 150 is from right to left. Thus, active selector line 142 provides a selection input to the gates of transistors 314, 316 which are coupled in series between the bitline 146 and master bitline 150.

As further shown in the cross-section of FIG. 3B, the conductive path from a bitline 136 to master bitline 150 is provided, as follows. When the bitline 136 is selected by an active selector line 140, a bi-directional conductive path, as shown by dotted arrow, exists through bitline contact 323 to drain diffusion region 382, then downwardly through the turned on left vertical transistor 310 into a left buried strap outdiffusion region 28 on the left side of the trench 20, then through the conductive fill within the trench 20 to a right buried strap outdiffusion region 28, and then upwardly again through vertical transistor 312 to drain diffusion region 384. Finally, conductive contacts 325 and 327 connect the drain diffusion region 384 to master bitline 150.

Similarly, on the right side of FIG. 3B, the bitline 146 is selectably connected to master bitline 150 by the transistors 316 and 314 which are operated by active selector line 142.

An equivalent circuit schematic is shown in the right side of FIG. 3C. Thus, active selector line 142 provides a selection input to the gates of a left vertical transistor 316, and a right vertical transistor 314, which are coupled in series between the bitline 146 and master bitline 150. As in the left side of the circuit, a parasitic (undesirable yet tolerable) capacitor 22, i.e. the capacitor formed in the lower part of the trench 20 below transistors 316 and 314, is coupled between the sources of transistors 316 and 314 and ground.

The vertical transistors 310, 312, 314, and 316 are part of an array of transistors that span the memory array, of which nearly all vertical transistors are used as storage cell transistors providing access to individual storage cells. Use of such vertical transistors to perform the function of multiplexing bitlines of the memory array to master bitlines, is desirable, as the vertical array transistors occupy considerably less chip area than planar transistors provided near the edges of the array, with which the support circuitry of the memory is ordinarily provided. In addition, by using vertical array transistors, multiplexers can be located within the footprint of the vertical transistor array, involving little additional wiring, and without requiring the well within which the vertical array transistors are formed to be interrupted.

As further shown in FIG. 3B, the master bitline 150 and its contacts 325, 327 to the diffusion region 384 are formed in a bordered manner relative to bitlines 136 and 146. In such bordered process, conductive via 330 of master bitline 150 is formed by a pattern on a mask subsequent to the formation of bitlines 136 and 146, in such a way that the mask must allow sufficient space between the bitline and the via 330, given mask overlay tolerances.

Figure 3D:
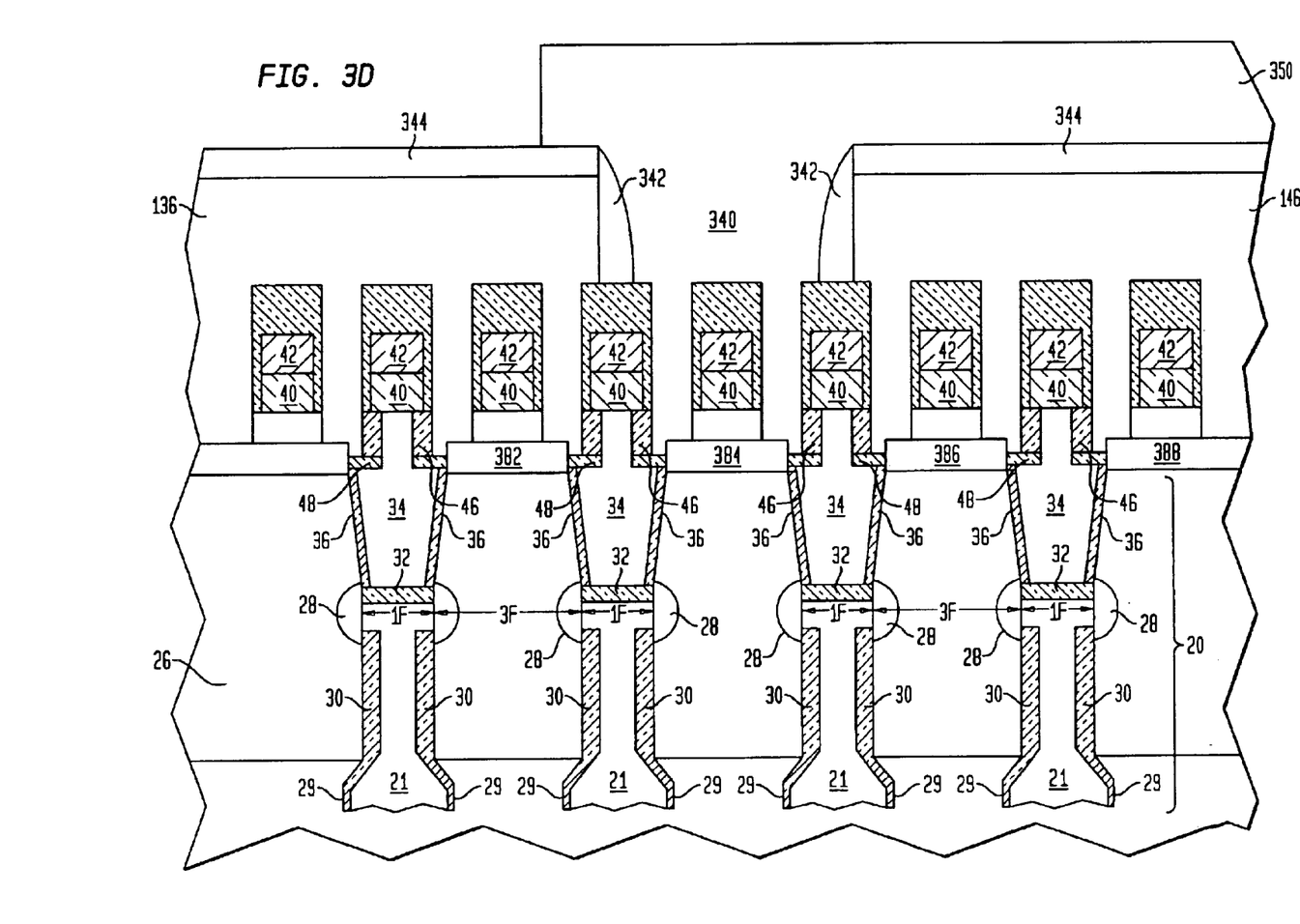
FIG. 3D illustrates an alternative embodiment in which the master bitline and a conductive via are formed in borderless manner to bitlines.

FIG. 3D illustrates an alternative embodiment in which the master bitline 350 and the conductive via 340 are formed in borderless manner to bitlines 136 and 146. As described above, a borderless process does not require a subsequent mask pattern to allow space for avoiding contact with prior conductive patterns, because the prior conductive patterns are insulated. In this case, bitlines 136 and 146 are provided with insulating sidewall spacers 342 and insulating caps 344 which insulate the bitlines from the subsequent etching of a contact hole and deposition therein to form conductive via 340 and master bitline 350.

Figure 3E:
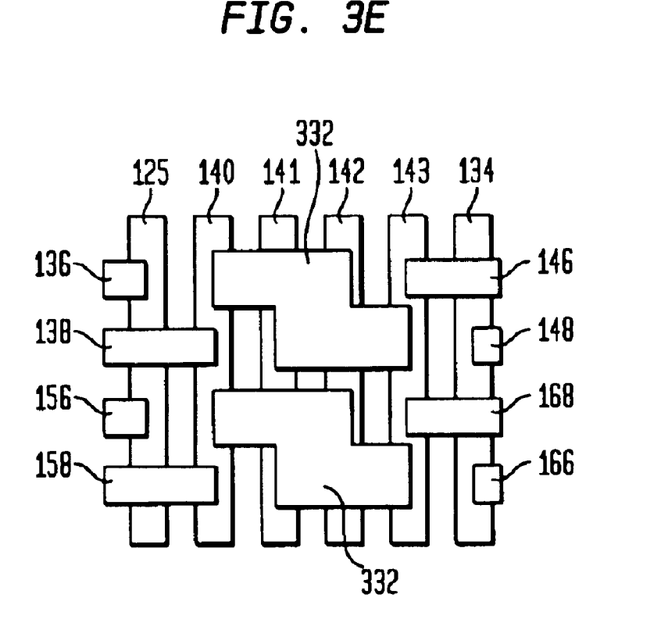
FIG. 3E is a plan view of the embodiment shown in FIGS. 3A–3C.

FIG. 3E is a plan view of the embodiment shown in FIGS. 3A–3C. As shown in FIG. 3E, bitlines run from left to right, while the selector lines 140 through 143 are shown running from top to bottom. In between, conductive contact patterns 332 provide interconnection between the drain diffusion regions 384 (not shown) of the substrate and the master bitline (not shown) which are formed above the conductive vias 332. In a particular embodiment, conductive contact patterns 332 are formed at the same time as the bitlines 136 and 146 by the same mask, so as to avoid mask overlay concerns. In such case, the spacing between bitline patterns and the conductive contact patterns 332 can be kept to a minimum, such as 1.0–1.5 F, with F being the minimum lithographic feature size. In such case, the size of the conductive contact patterns 332 can be made desirably large, for ease of providing landing pads for subsequent deposited vias. Alternatively, the conductive contact patterns 332 can be deposited in a process subsequent to the formation of bitlines 136 and 146, i.e. at the time of etching and forming conductive vias 330. In such case, the method of forming bordered contacts, as described above relative to FIG. 3B, can be used, or alternatively, the method of forming borderless contacts, as described above relative to FIG. 3D.

Operation proceeds as follows. Referring to FIG. 3A, a wordline 114 of a memory array 100 is activated by a wordline driver (not shown) which raises the voltage on the wordline 114 to a level above the threshold voltage of the transistors of storage cells coupled to the particular wordline 114. Either at that time, shortly before, or shortly thereafter, the selector line 140 coupled to select transistors N1, N5, and others (not shown) corresponding to the active wordline 114 is activated, such that bitlines 136 and 156 coupled to storage cells accessed by the active wordline 114 are coupled to master bitlines 150, and 170, respectively. At such time, only bitlines 136 and 156 of the bitlines that are shown in FIG. 3A are conductively coupled to the master bitlines 150 and 170, while all other bitlines that are shown in FIG. 3A are not coupled to the master bitlines 150 and 170. The signals from storage cells at the intersection of wordline 114 with bitline 136 and of wordline 114 with bitline 156 are then transferred through select transistors N1 and N5, respectively, to master bitlines 150 and 170, respectively, and on to sense amplifiers 127 and 128, respectively.

At sense amplifiers 127 and 128, respectively, the bitline signals are amplified, such that the "0" or "1" value of the data bit stored in each accessed storage cell is determined. If the operation is to read the stored data bits, signals representing the data bits are then transferred via the sense amplifiers 127 and 128 to other circuitry for output to an external interface of the memory. The data bits are also written back from the sense amplifiers to the accessed storage cells, because the act of reading an accessed storage cell dissipates the charge therein that indicates the data bit value. Thereafter, the wordline 114 and selector line 140 are deactivated, completing the read cycle.

On the other hand, if the operation is to write to the accessed storage cells, operation proceeds as described above for the read operation through the amplifying of bitline signals by sense amplifiers 127 and 128. Then signals representing the data bit to be written are transferred from the sense amplifiers 127 and 128 along master bitlines 150 and 170, respectively, to the selected bitlines 136 and 156, which then store the data bits as voltages on capacitors of the accessed storage cells. Thereafter, the wordline 114 and selector line 140 are deactivated, completing the write cycle.

Figure 4:
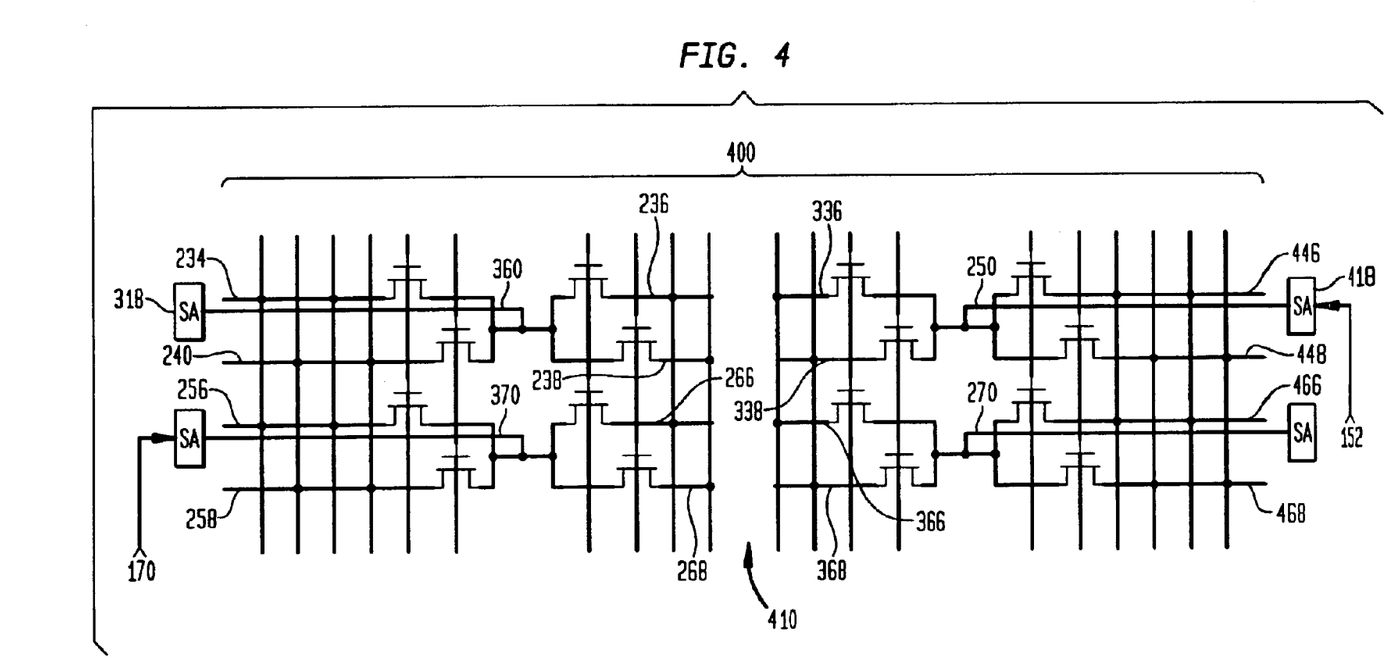
FIG. 4 is a schematic diagram illustrating another embodiment in which the bitlines of a memory array are further divided into a plurality of local bitlines.

FIG. 4 illustrates another embodiment in which the bitlines of a memory array 400 are divided into a plurality of local bitlines. For example, at the top of FIG. 4A, reading from left to right, the local bitlines 234, 236, 336 and 446 run linearly across the memory array 400. A break 410 separates the local bitlines 236 and 336 from each other. The break 410 is preferably accomplished through little variation in the manufacturing process. Thus, the break 410 need not consist of more than a brief interruption in the bitline patterns of the array, e.g. of a distance between one half to twice the wordline pitch, while other elements of the memory array, e.g. trench capacitors, vertical array transistors, wordline conductors, etc. remain as they are within the array of storage cells. As one way of creating such break 410, the photolithographic patterns of the mask used to pattern bitline contacts and/or bitlines can be altered such that the bitline contact patterns are interrupted at one or more breaks 410 within the array 400.

In such arrangement, on the upper left of FIG. 4, a group of bitlines 234, 236, 238, and 240 are served by a master bitline 360 coupled to a sense amplifier 318. On the upper right of FIG. 4, by contrast, another group of bitlines 336, 338, 446, and 448 are served by a different master bitline 250 which is coupled to another sense amplifier 418. By separating each bitline of the memory array 400 into a plurality of local bitlines as shown, the capacitance of each local bitline can be significantly reduced relative to the capacitance of a bitline that would otherwise extend across the entire memory array 400. Accordingly, in such arrangement, both the time needed and the amount of stored charge needed per storage cell to operate the memory array can be kept within tolerable levels, even if the row space of the memory array is increased, making the combined length of the local bitlines spanning the array very long. In addition, because the select transistors used for selecting a particular bitline for connection to the master bitline are part of an array of transistors including those of the memory array 400, very little additional IC area is consumed, as the array transistors provide a very compact arrangement, and no interruption of the well is required.

As these and other variations and combinations of the features discussed above can be utilized, the foregoing description of the preferred embodiments should be taken by way of illustration, rather than be way of limitation of the invention, as defined by the claims.

What is claimed is:

1. An integrated circuit comprising:
    a memory including:
    an array of transistors formed within a first well of a single-crystal semiconductor region of a substrate;
    a plurality of storage cells each including an access transistor, said access transistor being a transistor of said array of transistors;
    a plurality of bitlines, each said bitline coupled to the access transistors of respective storage cells of said plurality of storage cells; and
    a multiplexer including a first select transistor and a second select transistor of a plurality of select transistors, said plurality of select transistors being transistors of said array of transistors, said first select transistor being operable to select a first bitline of said plurality of bitlines to couple to a signal line, and said second select transistor being operable to select a second bitline of said plurality of bitlines to couple to said signal line.

2. The integrated circuit of claim 1 wherein said substrate has a main surface extending in a first horizontal direction and in a second horizontal direction transverse to said first horizontal direction, and wherein each said transistor of said array of transistors has a conduction channel which is oriented in a vertical direction substantially perpendicular to said first horizontal direction and said second horizontal direction.

3. The integrated circuit of claim 1 wherein said substrate has a main surface extending in a first horizontal direction and in a second horizontal direction transverse to said first horizontal direction, wherein said plurality of bitlines extend generally in said first horizontal direction and wherein each of said multiplexers further includes a plurality of conductors extending in said second horizontal direction, said plurality of conductors including a first conductor coupled to operate said first select transistor and a second conductor coupled to operate said second select transistor.

4. The integrated circuit of claim 3 wherein each of said plurality of conductors comprises a layer of polycrystalline silicon.

5. The integrated circuit of claim 4 wherein each said select transistor of said array of transistors has a conduction channel which is oriented in a vertical direction substantially perpendicular to said first horizontal direction and said second horizontal direction.

6. The integrated circuit of claim 5 wherein said signal line comprises a master bitline operable to conduct a signal between said bitline selected by said multiplexer and a sense amplifier.

7. The integrated circuit of claim 6 wherein said first select transistor and said second select transistor are conductively coupled to a first diffusion region of said single crystal semiconductor region and wherein said master bitline conductively contacts said first diffusion region.

8. The integrated circuit of claim 7 wherein said master bitline conductively contacts said first diffusion region in an area between conductors of said plurality of conductors.

9. The integrated circuit of claim 8 wherein said first select transistor includes a left transistor having a vertically oriented conduction channel and a right transistor having a vertically oriented conduction channel, said left transistor and said right transistor being coupled in series and being operable by said first conductor to select said first bitline to couple to the master bitline.

10. The integrated circuit of claim 9 wherein a drain region of said left transistor is conductively coupled to said first bitline, and a drain region of said right transistor is conductively coupled to said master bitline through said first diffusion region.

11. The integrated circuit of claim 10 wherein source regions of said left transistor and said right transistor are coupled together to a capacitor.

12. A method of operating a memory of an integrated circuit comprising:
    providing a memory including:
    an array of transistors formed within a first well of a single-crystal semiconductor region of a substrate, said array of transistors including first and second select transistors;
    a plurality of storage cells each including an access transistor, said access transistor being a transistor of said array of transistors;
    a plurality of bitlines including a first bitline and a second bitline, each said bitline coupled to the access transistors of respective storage cells of said plurality of storage cells;
    operating said first select transistor to connect said first bitline to a master bitline; and
    operating said second select transistor to connect said second bitline to a master bitline.

13. The method of claim 12 wherein said substrate has a main surface extending in a first horizontal direction and in a second horizontal direction transverse to said first horizontal direction, and wherein each said select transistor of said array of transistors has a conduction channel which is oriented in a vertical direction substantially perpendicular to said first horizontal direction and said second horizontal direction.

14. The method of claim 12 wherein said substrate has a main surface extending in a first horizontal direction and in a second horizontal direction transverse to said first horizontal direction, wherein said plurality of bitlines extend generally in said first horizontal direction and said first and second select transistors are operated by first and second conductors, respectively, said first and second conductors extending in said second horizontal direction.

15. The method of claim 14 wherein said first and second conductors comprises a layer of polycrystalline silicon.

16. The method of claim 15 wherein each of said first and second select transistors has a conduction channel which is oriented in a vertical direction substantially perpendicular to said first horizontal direction and said second horizontal direction.

17. The method of claim 16 further comprising conducting a signal on said master bitline between a selected bitline of said first bitline and said second bitline and a sense amplifier.

18. The method of claim 17 wherein said first and said second select transistors are connected by a first diffusion region of said single crystal semiconductor region to said master bitline.

19. The method of claim 18 wherein said master bitline conductively contacts said first diffusion region in an area between said first and said second conductors.

20. The method of claim 14 wherein said first select transistor includes a left transistor having a vertically oriented conduction channel and a right transistor having a vertically oriented conduction channel, said left transistor and said right transistor being coupled in series and being operable by said first conductor to select said first bitline to couple to the master bitline.

* * * * *